(12) United States Patent
Kwack et al.

(10) Patent No.: US 9,444,016 B2
(45) Date of Patent: Sep. 13, 2016

(54) LIGHT EMITTING DEVICE

(75) Inventors: Ho Sang Kwack, Seoul (KR); Hyun Soo Lim, Seoul (KR); Ju Hyon Song, Seoul (KR); Hyun Kyong Cho, Seoul (KR); Ho Ki Kwon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 29 days.

(21) Appl. No.: 13/462,044

(22) Filed: May 2, 2012

(65) Prior Publication Data

US 2013/0001617 A1 Jan. 3, 2013

(30) Foreign Application Priority Data

Jun. 30, 2011 (KR) ................. 10-2011-0065178

(51) Int. Cl.
*H01L 33/46* (2010.01)
*H01L 33/40* (2010.01)
*H01L 33/00* (2010.01)

(52) U.S. Cl.
CPC ......... *H01L 33/405* (2013.01); *H01L 33/0079* (2013.01); *H01L 33/46* (2013.01); *H01L 2224/48091* (2013.01)

(58) Field of Classification Search
CPC . H01L 33/46; H01L 33/0079; H01L 33/405; H01L 222/48091; H01L 33/14; H01L 33/20; H01L 33/24; H01L 33/38; H01L 33/44; H01L 33/58; H01L 33/60; H01L 33/145; H01L 2933/0058; H01L 33/10; H01L 33/025
USPC ................. 257/98–99, E33.068, E33.064
See application file for complete search history.

(56) References Cited

U.S. PATENT DOCUMENTS

| | | | | |
|---|---|---|---|---|
| 6,492,661 B1 * | 12/2002 | Chien | ................. | H01L 33/0079 257/103 |
| 8,222,660 B2 * | 7/2012 | Hwang | ................. | H01L 27/15 257/103 |
| 8,227,280 B2 * | 7/2012 | Niki | ................. | H01L 33/007 257/103 |
| 8,251,520 B2 * | 8/2012 | Erchak et al. | ................. | 353/94 |
| 8,344,402 B2 * | 1/2013 | Niki et al. | ................. | 257/98 |
| 8,350,274 B2 * | 1/2013 | Cho | ................. | 257/79 |
| 8,373,190 B2 * | 2/2013 | Hwang | ................. | 257/98 |
| 8,415,689 B2 * | 4/2013 | Lim | ................. | 257/91 |
| 8,513,679 B2 * | 8/2013 | Jeong | ................. | H01L 33/405 257/79 |
| 8,710,537 B2 * | 4/2014 | Engl | ................. | H01L 27/15 257/99 |
| 9,117,971 B2 * | 8/2015 | Jeong | ................. | H01L 33/145 |
| 2006/0232195 A1 * | 10/2006 | Cok | ................. | H01L 51/5268 313/504 |
| 2009/0272994 A1 * | 11/2009 | Lim | ................. | H01L 33/382 257/97 |
| 2010/0213485 A1 * | 8/2010 | McKenzie | ................. | H01L 33/20 257/98 |
| 2011/0089452 A1 * | 4/2011 | Jeong | ................. | H01L 33/405 257/98 |
| 2011/0133242 A1 * | 6/2011 | Choi | ................. | H01L 33/38 257/99 |
| 2011/0186814 A1 * | 8/2011 | Kim | ................. | 257/13 |
| 2011/0198626 A1 * | 8/2011 | Edmond | ................. | H01L 33/0079 257/88 |
| 2011/0241574 A1 * | 10/2011 | Erchak | ................. | G03B 21/204 315/312 |
| 2012/0018764 A1 * | 1/2012 | Choi | ................. | H01L 33/20 257/99 |

* cited by examiner

*Primary Examiner* — Matthew W Such
*Assistant Examiner* — Stephen C Smith
(74) *Attorney, Agent, or Firm* — Ked & Associates LLP

(57) ABSTRACT

Provided are a light emitting device, a light emitting device package, and a lighting system. The light emitting device comprises a reflective layer, a second conductive type semiconductor layer on the reflective layer, an active layer on the second conductive type semiconductor layer, a first conductive type semiconductor layer on the active layer, and a pad electrode on the first conductive type semiconductor layer. The reflective layer comprises a predetermined pattern.

22 Claims, 9 Drawing Sheets

LIGHT EMITTING DEVICE

CROSS-REFERENCE TO RELATED APPLICATIONS

This application claims under 35 U.S.C. §119 to Korean Patent Application No. 10-2011-0065178, filed Jun. 30, 2011, which is hereby incorporated by reference in its entirety.

BACKGROUND

Embodiments relate to a light emitting device, a light emitting device package, and a lighting system.

Light emitting devices are compound semiconductor devices that convert electric energy into light energy. Light emitting devices may realize various colors by adjusting a composition ratio of a compound semiconductor.

When a forward voltage is applied into a light emitting device, the light emitting device emits light having energy corresponding to an energy gap between a conduction band and a valance band due to combination between electrons within an N-type layer and holes within a P-type layer. The energy may be mainly emitted in a heat or light state. Here, the light emitting device emits the energy in the light state.

For example, since a nitride semiconductor has high thermal stability and wide band gap energy, the nitride semiconductor comes into the spotlight in development fields of optical devices and high-output electronic devices. Specifically, blue, green, and ultraviolet (UV) light emitting devices using nitride semiconductors are commercialized, and are being widely used.

Light emitting devices may be classified into lateral type light emitting devices and vertical type light emitting devices according to positions of electrodes.

Specifically, a vertical type light emitting structure has a structure in which upper and lower electrodes are respectively disposed on upper and lower portions thereto and connected to each other. Thus, it may be unnecessary to perform a mesa etching process for connecting the electrodes to each other. Also, in the case of the vertical type light emitting structure, a reflective layer may be further disposed between a light emitting layer for emitting light and the lower electrode to improve light extraction efficiency.

The upper electrode disposed on the light emitting layer may have a minimum area to optimize the light extraction efficiency.

However, the upper electrode requires an electrode part (a pad electrode) having a pad shape and a wide area to stably connect a wire thereto. Also, an electrode part (a branch electrode) having a branch shape for supplying a power to an upper light emitting structure should have a predetermined area for improving a spreading effect.

SUMMARY

Embodiments provide a light emitting device which improves external light extraction efficiency, a light emitting device package, and a lighting system.

In one embodiment, a light emitting device comprises: a reflective layer; a second conductive type semiconductor layer on the reflective layer; an active layer on the second conductive type semiconductor layer; a first conductive type semiconductor layer on the active layer; and a pad electrode on the first conductive type semiconductor layer, wherein the reflective layer comprises a predetermined pattern.

In the light emitting device, the light emitting device package, and the lighting system according to the embodiments, the reflective layer may be manufactured in the patterned shape to change a path of light which is vertically incident into the pad electrode and thus is not extracted to the outside, thereby improving the external light extraction efficiency.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package, and a lighting system according to embodiments will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiments)

Figure 1:
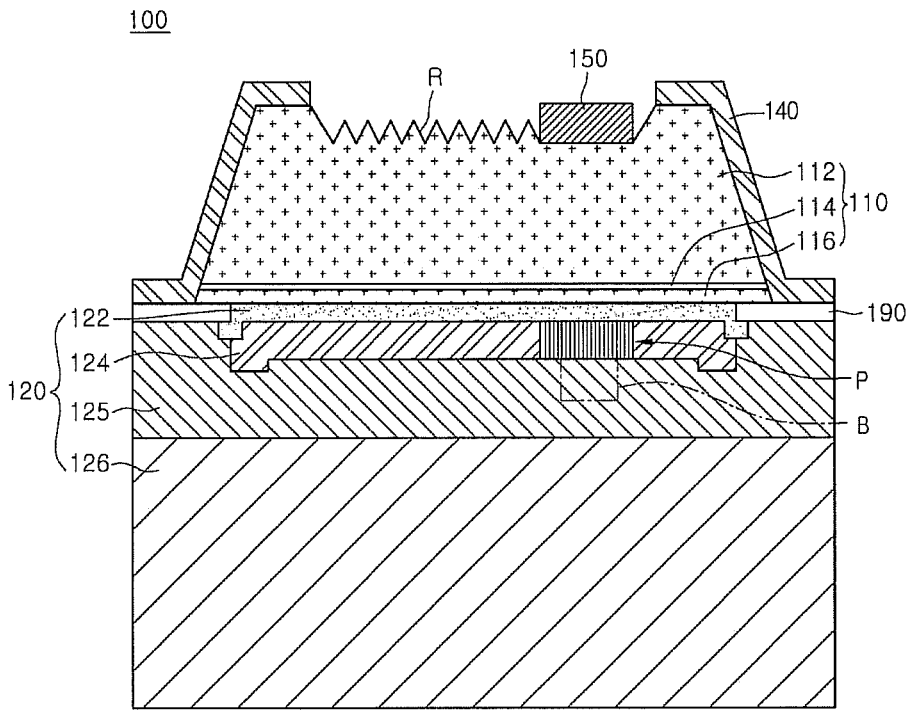
FIG. 1 is a sectional view of a light emitting device according to an embodiment.
Figure 2:
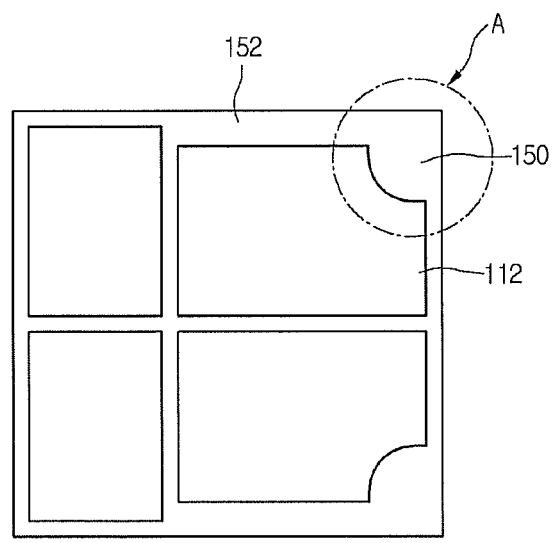
FIG. 2 is a plan view of a light emitting device according to an embodiment.

FIG. 1 is a sectional view of a light emitting device 100 according to an embodiment. FIG. 2 is a plan view of a light emitting device according to an embodiment.

The light emitting device 100 according to an embodiment may include a reflective layer 124, a second conductive type semiconductor layer 116 on the reflective layer 124, an active layer 114 on the second conductive type semiconductor layer 116, a first conductive type semiconductor layer 112 on the active layer 114, and a pad electrode 150 on the first conductive type semiconductor layer 112. The reflective layer 124 may include a predetermined pattern P.

The second conductive type semiconductor layer 116, the active layer 114, and the first conductive type semiconductor layer 112 may constitute a light emitting structure 110.

In the current embodiment, a second electrode layer 120 may be disposed under the light emitting structure 110. The second electrode layer 120 may include an ohmic layer 122, the reflective layer 124, a bonding layer 125, and a second substrate 126. Also, a protection member 190 may be disposed outside a lower side of the light emitting structure 110.

A roughness R may be disposed on a top surface of the light emitting structure 110 to improve light extraction efficiency. A passivation layer 140 may be disposed outside the light emitting structure 110.

In the current embodiment, the pattern P of the reflective layer 124 may be disposed in a region in which the reflective layer 124 vertically overlaps the pad electrode 150.

In the light emitting device according to the current embodiment, the region of the reflective layer 124 vertically overlapping the pad electrode 150 may be manufactured in a patterned shape to change a path of light which is incident into the pad electrode 150 and thus is not extracted to the outside, thereby improving external light extraction efficiency.

FIGS. 3A to 3D are enlarged views illustrating a region A of the pad electrode 150 of FIG. 2. That is, FIGS. 3A to 3D are opened-up views illustrating the pattern of the reflective layer disposed under the pad electrode 150 in the light emitting device according to an embodiment.

Figure 3A:
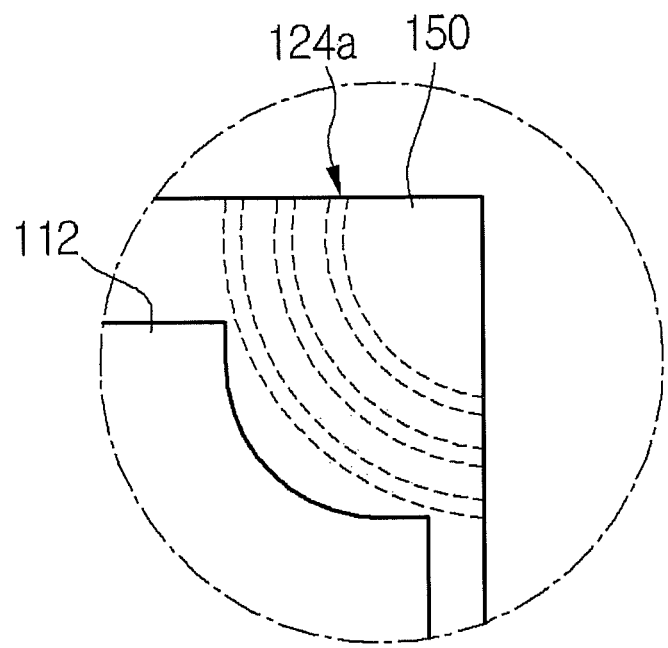
FIGS. 3A to 3D are views illustrating examples of a pattern of a reflective layer in a light emitting device according to an embodiment.

According to the current embodiment, a flat pattern P of the reflective layer may include a strip pattern to improve light extraction efficiency by refraction and interference effects with respect to light. For example, the flat pattern p of the reflective layer may have a streamlined strip shape 124a as shown in FIG. 3A, an inclined straight strip shape 124c as shown in FIG. 3C, or a vertical straight strip shape 124d as shown in FIG. 34D, but is not limited thereto.

Figure 3B:
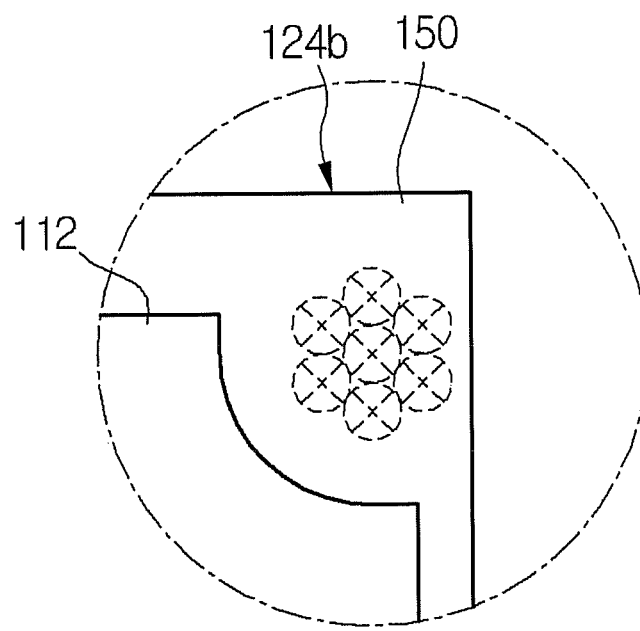
Figure 3C:
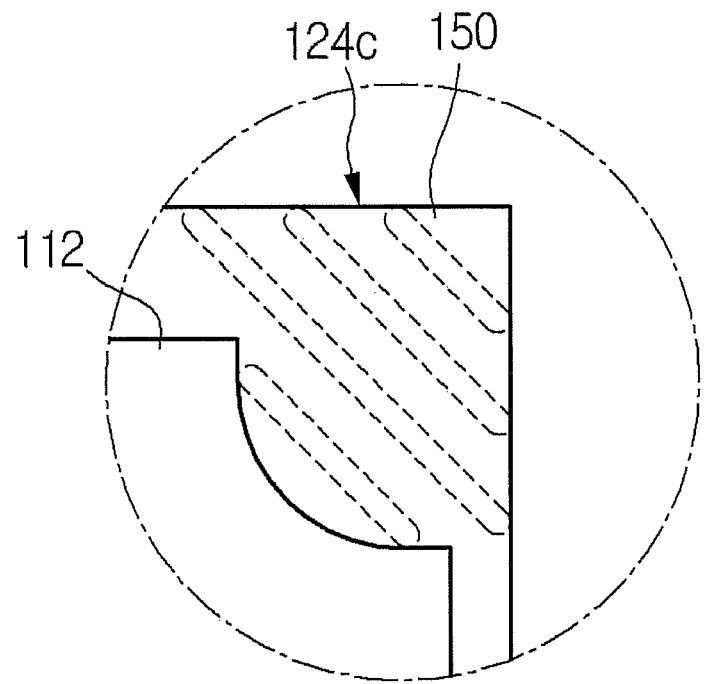
Figure 3D:
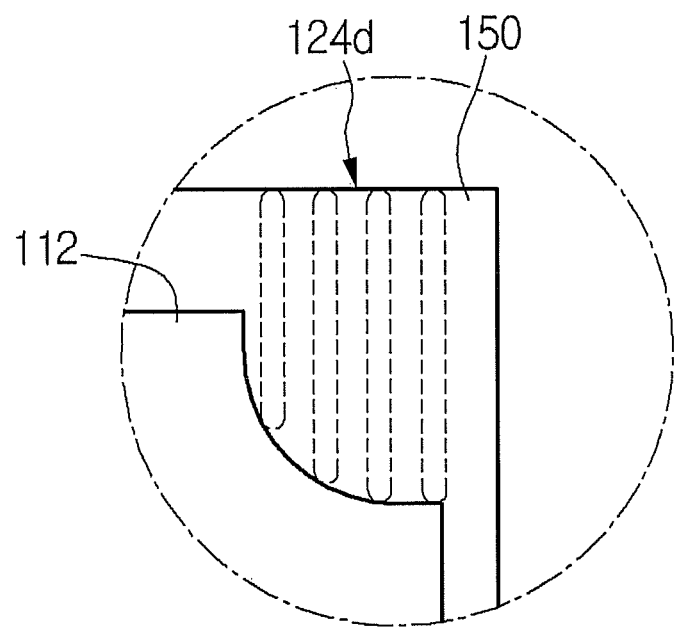

The flat pattern P of the reflective layer may have a circular shape 124b as shown in FIG. 3B to change a path of light, thereby improving light extraction efficiency.

FIGS. 3E to 3H are sectional views illustrating examples of the pattern of the reflective layer in the light emitting device according to an embodiment. For example, FIGS. 3E to 3H are enlarged sectional views illustrating the pattern of the reflective layer in a region B of the pad electrode of FIG. 1.

According to the current embodiment, a sectional pattern P of the reflective layer may include a polygonal pattern to expand a surface area of the reflective layer and a light escape path, thereby improving the external light extraction efficiency.

Figure 3E:
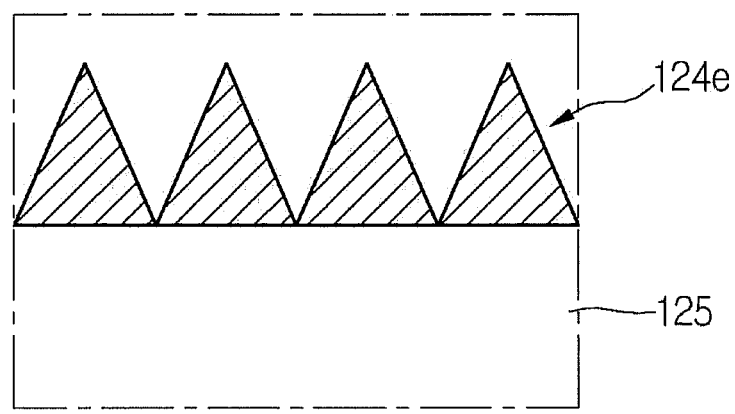
FIGS. 3E to 3H are sectional views illustrating examples of a pattern of a reflective layer in a light emitting device according to an embodiment.
Figure 3F:
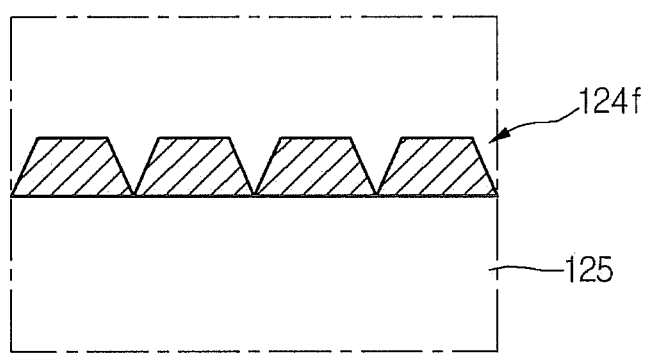
Figure 3G:
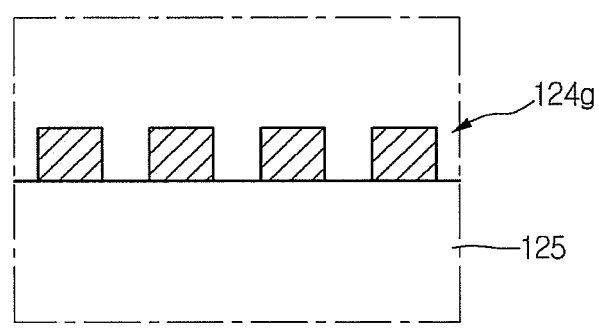

For example, the sectional pattern P of the reflective layer may be a reflective layer 124e that is a pyramid pattern including a predetermined edge as shown in FIG. 3e, a reflective layer 124f that is a trapezoidal pattern as shown in FIG. 3f, or a reflective layer 124g that is a square pattern as shown in FIG. 3g, but is not limited thereto.

Figure 3H:
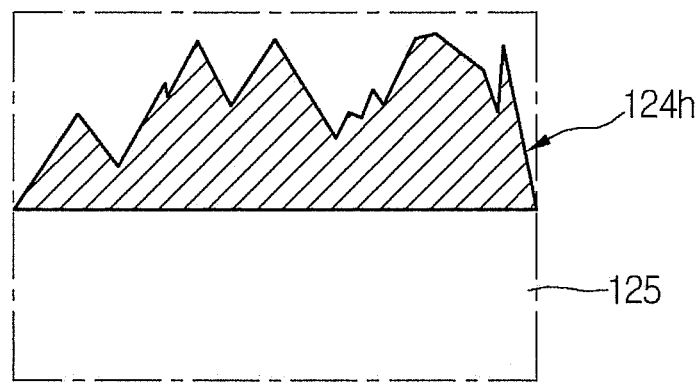

Also, in the current embodiment, the sectional pattern P of the reflective layer may include a random roughness pattern as shown in FIG. 3H to change a light path, and simultaneously, to expand a surface area of the reflective layer and a light escape path, thereby improving the external light extraction efficiency.

According to the current embodiment, various sectional patterns P may be disposed on the reflective layer to change the light path, thereby improving the external light extraction efficiency. Also, since the various sectional patterns are provided, the surface area of the reflective layer may be expanded to expand the light escape path, thereby improving the external light extraction efficiency.

Also, according to the current embodiment, the pattern of the reflective layer may be disposed on the reflective layer in a region in which the reflective layer overlaps the electrode 152 (see FIG. 2) in addition to the region in which the reflective layer overlaps the pad electrode.

In the current embodiment, according to a structure in which the reflective layer of the light emitting device is developed, the reflective layer formed of Ag or Al and disposed on a lower end of an n-pad may be manufactured in a patterned shape, but a flat shape. Thus, light may be vertically incident into the n-pad to change a path of light which is not extracted to improve the external light extraction efficiency.

According to the current embodiment, a region occupied by the pad electrode may range from about 10% to about 15% of the reflective layer. Thus, a predetermined pattern may be disposed on the reflective layer 124 to improve the light extraction efficiency.

Also, according to the current embodiment, as a chip is increased in light intensity and area, the n-pad design may become important. Since the pattern is disposed on the reflective layer, a limitation in a design of the pad may be solved.

In the light emitting device according to the current embodiment, the reflective layer may be manufactured in the patterned shape to change a path of light which is not extracted because the light is vertically incident, thereby improving the external light extraction efficiency.

Hereinafter, a method of manufacturing a light emitting device according to an embodiment will be described with reference to FIGS. 4 to 7.

Figure 4:
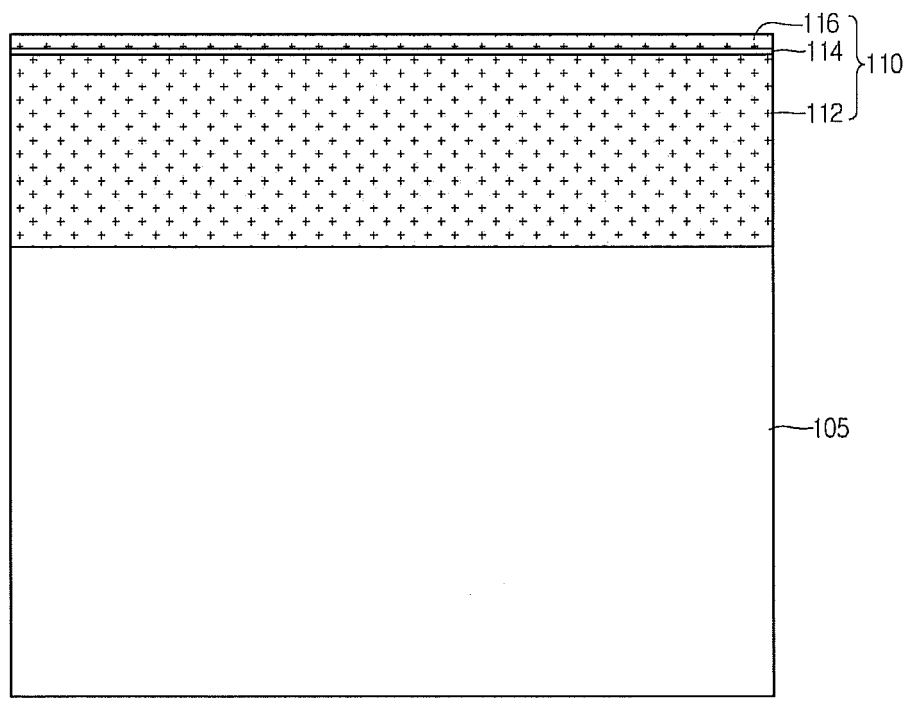
FIGS. 4 to 7 are sectional views illustrating a process of manufacturing a light emitting device according to an embodiment.
Figure 5:
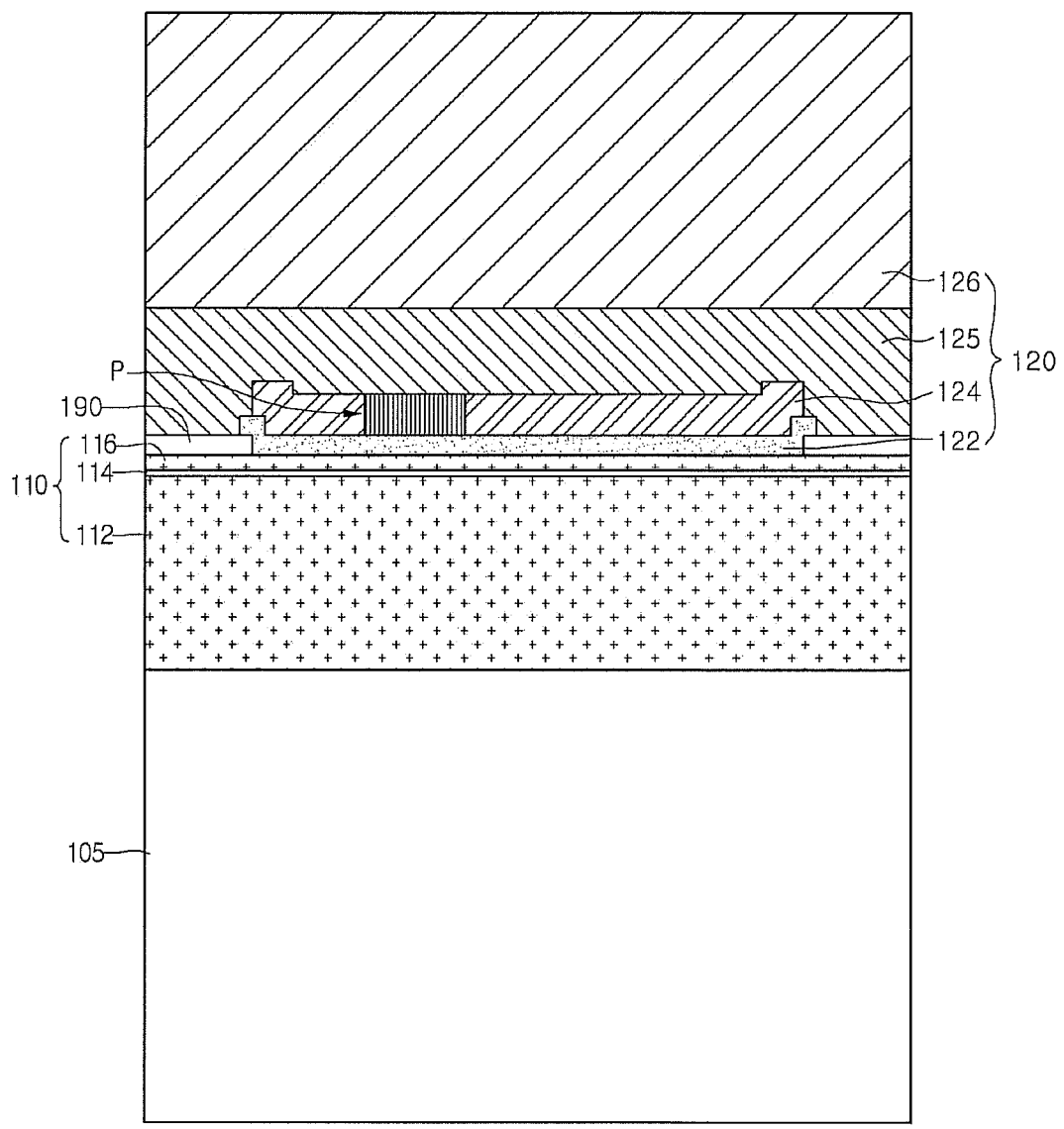

First, a first substrate 105 is prepared as shown in FIG. 4. The first substrate 105 may include a conductive substrate or an insulating substrate. For example, the first substrate 105 may be formed of at least one of sapphire ($Al_2O_3$), SiC, Si, GaAs, GaN, ZnO, GaP, InP, Ge, and $Ga_2O_3$. A roughness structure may be formed on the first substrate 105, but is not limited thereto. A wet cleaning process may be performed on the first substrate 105 to remove impurities from a surface of the first substrate 105.

Thereafter, a light emitting structure 110 including a first conductive type semiconductor layer 112, an active layer 114, and a second conductive type semiconductor layer 116 may be formed on the first substrate 105.

A buffer layer (not shown) may be formed on the first substrate 105. The buffer layer may reduce lattice mismatching between a material of the light emitting structure 110 and the first substrate 105. The buffer layer may be formed of a group III-V compound semiconductor, for example, at least one GaN, InN, AlN, InGaN, AlGaN, InAlGaN, and AlInN.

An undoped semiconductor layer (not shown) may be formed on the buffer layer, but is not limited thereto.

Thereafter, the first conductive type semiconductor layer 112 may be formed on the buffer layer or the undoped semiconductor layer.

The first conductive type semiconductor layer 112 may be formed of a group III-V compound semiconductor doped with a first conductive type dopant. When the first conductive type semiconductor layer 112 is an N-type semiconductor layer, the first conductive type dopant may include Si, Ge, Sn, Se, or Te as the N-type dopant, but is not limited thereto.

The first conductive type semiconductor layer 112 may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may be formed as an N-type GaN layer by using a method such as chemical vapor deposition (CVD), molecular beam epitaxy (MBE), sputtering, or hydride vapor phase epitaxy (HVPE). The first conductive type semiconductor layer 112 may be formed by injecting silane ($SiH_4$) gas containing N-type impurities such as trimethyl gallium (TMGa) gas, ammonia ($NH_3$) gas, nitrogen ($N_2$) gas, and silicon (Si) into a chamber.

In the current embodiment, a current spreading layer (not shown) may be formed on the first conductive type semiconductor layer 112. The current spreading layer may be an undoped GaN layer, but is not limited thereto.

Also, in the current embodiment, an electron injection layer (not shown) may be formed on the current spreading layer. The electron injection layer may be a first conductive type GaN semiconductor layer. For example, the electron injection layer may be doped with an N-type doping element at a concentration of $6.0 \times 10^{18}$ atoms/$cm^3$ to $8.0 \times 10^{18}$ atoms/$cm^3$. Thus, the electrons may be effectively injected.

Also, in the current embodiment, a strain control layer (not shown) may be formed on the electron injection layer. For example, the strain control layer formed of a semiconductor material having a compositional formula of $In_yAl_xGa_{(1-x-y)}N$ ($0 \leq x \leq 1$, $0 \leq y \leq 1$)/GaN may be formed on the electron injection layer. The strain control layer may effectively reduce a stress due to lattice mismatching between the first conductive type semiconductor layer 112 and the active layer 114.

Also, in the strain control layer, since semiconductor materials having compositions of a first $In_{x1}GaN$ and a second $In_{x2}GaN$ are repeatedly stacked by at least 6 cycles, more electrons may be concentrated into a low energy level of the active layer 114. Thus, recombination between electrons and holes may be increased to improve light emitting efficiency.

Thereafter, the active layer 114 may be formed on the strain control layer.

The active layer 114 may be a layer in which electrons injected through the first conductive type semiconductor layer 112 meet holes injected through the second conductive type semiconductor layer 116 to be formed later to emit light having energy determined by the natural energy band of the active layer 114 (light emitting layer).

The active layer 114 may have at least one of a single quantum well structure, a multi quantum well (MQW) structure, a quantum wire structure, and a quantum dot structure. For example, the active layer 114 may have a multi quantum well (MQW) structure that is formed by injecting trimethyl gallium (TMGa) gas, ammonia ($NH_3$) gas, nitrogen ($N_2$) gas, and trimethyl indium (TMIn) gas, but the present disclosure is not limited thereto.

For example, a well layer/barrier layer of the active layer 114 may have a pair structure with at least one of InGaN/GaN, InGaN/InGaN, GaN/AlGaN, InAlGaN/GaN, GaAs (InGaAs)/AlGaAs, and GaP(InGaP)/AlGaP, but is not limited thereto. The well layer may be formed of a material having a band gap less than that of the barrier layer.

Thereafter, in the current embodiment, an electron blocking layer (not shown) may be formed on the active layer 114 to perform an electron blocking function and serve as MQW cladding of the active layer 114, thereby improving light emitting efficiency. For example, the electron blocking layer may be formed of a semiconductor having a compositional formula of $Al_xIn_yGa_{(1-x-y)}N$ ($0 \leq x \leq 1$, $0 \leq y \leq 1$). Also, the electron blocking layer may have an energy band gap greater than that of the active layer 114.

Also, the electron blocking layer may be doped with P-type ions. For example, the electron blocking layer may be doped with Mg at a concentration of about $10^{18}$ atoms/$cm^3$~$10^{20}$ atoms/$cm^3$ to efficiently block overflowing electrons, but is not limited thereto.

Thereafter, the second conductive type semiconductor layer 116 may be formed on the electron blocking layer (not shown).

The second conductive type semiconductor layer 116 may be formed of a group III-V compound semiconductor that is doped with a second conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). When the second conductive type semiconductor layer 116 is a P-type semiconductor layer, the second conductive type dopant may include Mg, Zn, Ca, Sr, and Ba as a P-type dopant.

The second conductive type semiconductor layer 116 may be formed as a p type GaN layer by injecting trimethyl gallium (TMGa) gas, ammonia ($NH_3$) gas, nitrogen ($N_2$) gas, and trimethyl indium (TMIn) gas, and bis-ethyl-cyclopentadienyl-magnesium $(_{EtCp2Mg})$ {$Mg(C_2H_5C_5H_4)_2$} including p type impurities such as magnesium (Mg) into a chamber, but the present disclosure is not limited thereto.

In the embodiment, the first conductive type semiconductor layer 112 may be realized as the N-type semiconductor layer, and the second conductive type semiconductor layer 116 may be realized as the P-type semiconductor layer, but are not limited thereto. Also, a semiconductor having a polarity opposite to that of the second conductive type semiconductor layer, e.g., an N-type semiconductor layer (not shown) may be disposed on the second conductive type semiconductor layer 116. Accordingly, the light emitting structure 110 may have one of an N—P junction structure, a P—N junction structure, an N—P—N junction structure and a P—N—P junction structure.

Thereafter, a second electrode layer 120 is formed on the second conductive type semiconductor layer 116.

The second electrode layer 120 may include an ohmic layer 122, a reflective layer 124, a bonding layer 125, and second substrate 126.

For example, the second electrode layer 120 may include an ohmic layer 122. That is, the second electrode layer 120 may be formed by multiply stacking a single metal or a metal alloy, and a metal oxide so that holes are efficiently injected. For example, the ohmic layer (122) may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, $IrO_x$, $RuO_x$, NiO, $RuO_x$/ITO, Ni/$IrO_x$/Au, and Ni/$IrO_x$/Au/ITO, Ag, Ni, Cr, Ti, Al, Rh, Pd, Ir, Ru, Mg, Zn, Pt, Au, and Hf, but is not limited thereto.

Also, when the second electrode layer 120 includes the reflective layer 124, the second electrode layer 120 may be a metal layer containing Al, Ag, or an alloy including Al or Ag. Aluminum or silver effectively reflects light emitted from the active layer to significantly improve the light extraction efficiency of the light emitting device.

Also, when the second electrode 120 includes the bonding layer 125, the reflective layer 124 may be function as the bonding layer, or the bonding layer 125 may be formed of nickel (Ni) or gold (Au).

Also, the second substrate 126 may be formed of a metal, a metal alloy, or a conductive semiconductor material which have high electric conductivity so that the holes are efficiently injected. For example, the second substrate 126 may be selectively formed of copper (Cu), copper alloy, gold (Au), nickel (Ni), copper-tungsten (Cu—W), and a carrier wafer (e.g., GaN, Si, Ge, GaAs, ZnO, SiGe, and SiC). A method of forming the second substrate 126 may include an electrochemical metal deposition method and a bonding method using a eutectic metal.

In the current embodiment, a protection member 190 may be formed outside a lower side of the light emitting structure 110. Also, a current blocking layer (CBL, not shown) may be formed between the light emitting structure 110 and the ohmic layer 122.

The protection member 190 may be formed on a circumference between the light emitting structure 110 and the bonding layer 125. The protection member 190 may have a ring shape, a loop shape, or a square frame shape. A portion of the protective member 190 may vertically overlap the light emitting structure 110.

The passivation member 190 spaces a side surface of the bonding layer 125 from a side surface of the active layer 114 to reduce possibility of electrical short-circuit between the bonding layer 125 and the active layer 114.

In addition, the protection member 190 may prevent an electrical short-circuit from occurring in a chip separation process.

The protection member 190 may be formed of an electrically insulating material or a material having conductivity less than that of the reflective layer 124 or the bonding layer 125. For example, the protection member 190 may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, and Cr.

In the current embodiment, the reflective layer 124 may include a predetermined pattern P in a region in which the reflective layer 124 vertically overlaps a pad electrode 150 that will be formed later.

To form the pattern P on the reflective layer 124, a predetermined photoresist pattern or an insulation layer pattern may be formed, and then a material of the reflective layer 124 may be formed on the photoresist pattern or the insulation layer pattern. Then, the photoresist pattern or the insulation layer pattern may be removed to form the pattern P. However, the present disclosure is not limited thereto.

According to the light emitting device, the reflective layer 124 disposed on a lower end of the pad electrode has a patterned shape, but a flat shape, to change a path of light which is not extracted because the light is vertically incident, thereby improving the external light extraction efficiency.

In the current embodiment, the flat pattern P of the reflective layer may have a strip shape, a circular shape, an inclined straight strip shape, or a vertical straight strip shape, but is not limited thereto.

Also, in the current embodiment, a sectional pattern P may include at least one of a pyramid pattern, a trapezoidal pattern, a square pattern, and a random roughness.

Also, according to the current embodiment, the pattern P of the reflective layer may be formed on the reflective layer 124 in a region in which the reflective layer overlaps the electrode 152 in addition to the region in which the reflective layer overlaps the pad electrode.

In the current embodiment, according to a structure in which the reflective layer of the light emitting device is developed, the reflective layer formed of Ag or Al and disposed on a lower end of an n-pad may be manufactured in a patterned shape, but a flat shape. Thus, light may be vertically incident into the n-pad to change a path of light which is not extracted to improve the external light extraction efficiency.

According to the current embodiment, a region occupied by the pad electrode may range from about 10% to about 15% of the reflective layer. Thus, a predetermined pattern may be disposed on the reflective layer 124 to improve the light extraction efficiency.

Also, according to the current embodiment, as a chip is increased in light intensity and area, the n-pad design may become important. Since the pattern is disposed on the reflective layer, a limitation in a design of the pad may be solved.

In the method of manufacturing the light emitting device according to the current embodiment, the reflective layer may be manufactured in the patterned shape to change a path of light which is not extracted when the light is vertically incident, there by improving the external light extraction efficiency.

Figure 6:
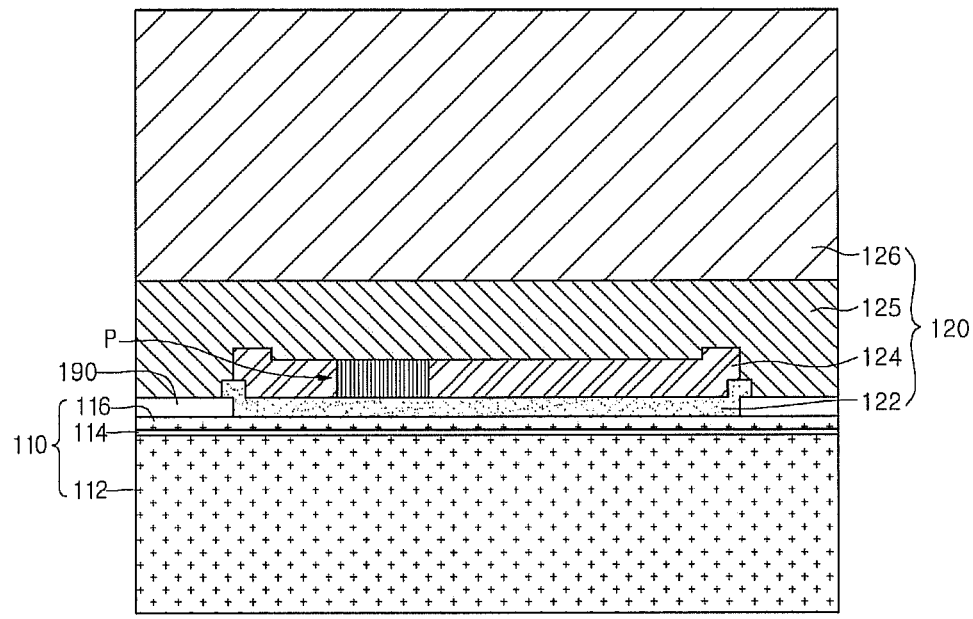

Thereafter, as shown in FIG. 6, the first substrate 105 is removed to expose the first conductive type semiconductor layer 112. The first substrate 105 may be separated using a high power laser or etched using a chemical etching method. In addition, the first substrate 105 may be removed using a physical grinding method.

For example, according to a lift-off method using a laser, when predetermined energy is applied at room temperature, the energy may be absorbed into an interface between the first substrate 105 and the light emitting structure 110 to thermally decompose a boned surface of the light emitting structure, thereby separating the first substrate 105 from the light emitting structure 110.

Figure 7:
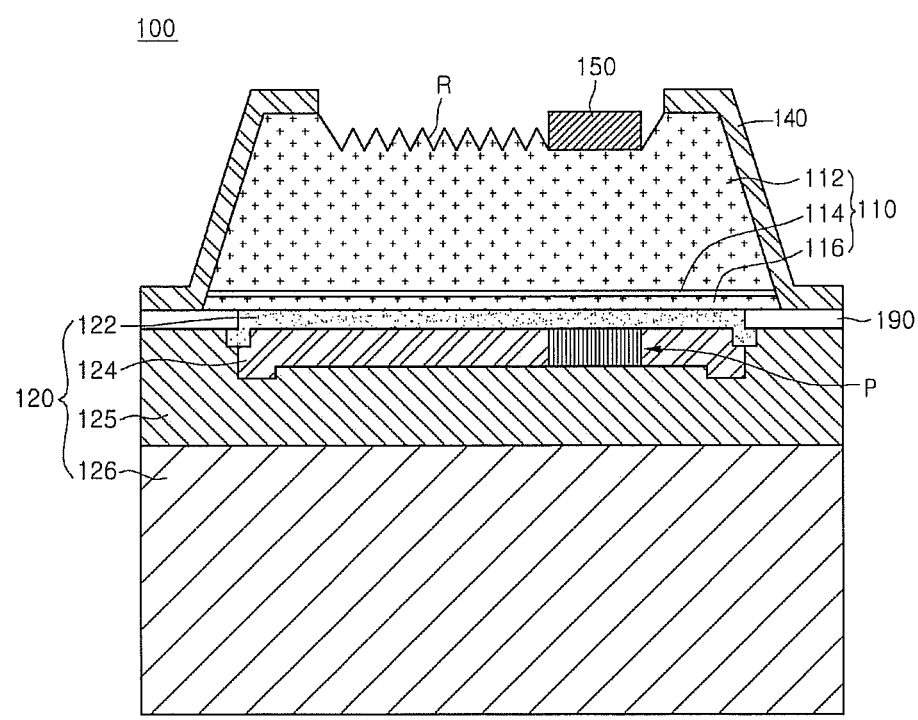

Next, the light emitting device is separated for each chip as shown in FIG. 7. Here, the light emitting structure 110 may be separated into a predetermined inclined shape on the basis of properties of a single crystal direction, but is not limited thereto.

A roughness R may be formed on a top surface of the light emitting structure 110 to improve the light extraction efficiency. A passivation layer 140 may be formed outside the light emitting structure 110.

An electrode 152 (see FIG. 2) may be formed on the light emitting structure 110. Also, a pad electrode 150 may be formed on the electrode 152.

In the light emitting device according to the current embodiment, the reflective layer may be manufactured in the patterned shape to change a path of light which is not extracted when the light is vertically incident, there by improving the external light extraction efficiency.

Figure 8:
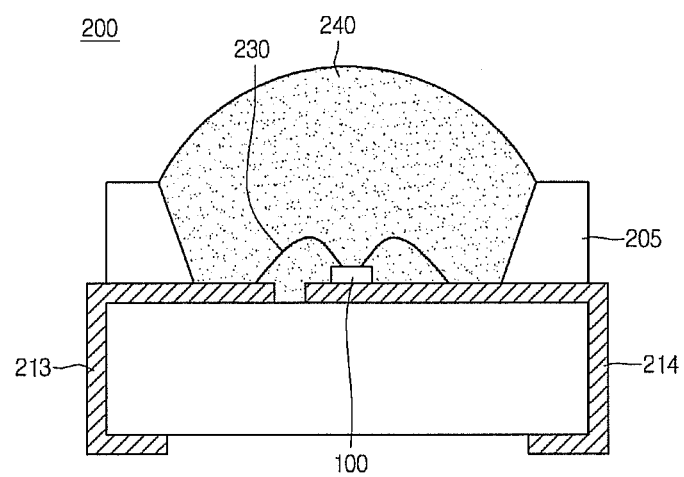
FIG. 8 is a sectional view of a light emitting device package according to an embodiment.

FIG. 8 is a cross-sectional view illustrating a light emitting device package including a light emitting device according to embodiments.

The light emitting device package according to an embodiment includes a package body 205, third and fourth electrode layers 213 and 214 disposed on the package body 205, a light emitting device 100 disposed on the package body 205 and electrically connected to the third and fourth electrode layers 213 and 214, and a molding member 240 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 may be electrically separated from each other and also supply power to the light emitting device 100. Also, the third electrode layer 213 and the fourth electrode layer 214 may reflect light generated in the light emitting device 100 to improve light efficiency, and may release heat generated in the light emitting device 100 to the outside.

The vertical type light emitting device exemplified in FIG. 1 may be applied to the light emitting device 100, but is not limited thereto.

The light emitting device 100 may be disposed on the package body 205 or the third or fourth electrode layer 213 or 214.

The light emitting device 100 may be electrically connected to the third and/or fourth electrode layers 213 and/or 214 through one of a wiring process, a flip-chip process, and a die bonding process. According to the current embodiment, the light emitting device 100 may be electrically connected to the third conductive layer 213 through a wire 230 and may directly contact the fourth conductive layer 214 and thus be electrically connected to the fourth conductive layer 214.

The molding member 240 may surround the light emitting device 100 to protect the light emitting device 100. The molding member 240 may include a phosphor to vary a wavelength of light emitted form the light emitting device 100.

The light emitting device package 200 may be provided in plurality on a board, and optical members such as a light guide plate, a prism sheet, a diffusion sheet, and a fluorescent sheet may be disposed in a path of light emitted from the light emitting device package 200. The light emitting device package 200, the board, and the optical members may function as a backlight unit or a lighting unit. For example, a lighting system may include backlight units, lighting units, indicating devices, lamps, and street lamps.

Figure 9:
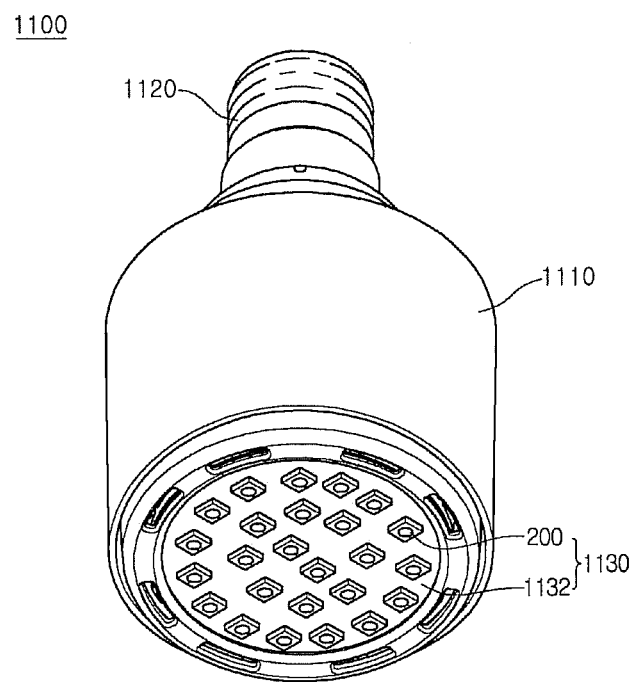
FIG. 9 is a perspective view of a lighting unit according to an embodiment.

FIG. 9 is a perspective view of a lighting unit 1100 according to an embodiment. However, the lighting unit 1100 of FIG. 9 is described as an example of the lighting system. Thus, the present disclosure is not limited thereto.

In the current embodiment, the lighting unit 1100 may include a case body 1110, a light emitting module 1130 disposed on the case body 1110, and a connection terminal 1120 disposed on the case body 1110 to receive power from an external power source.

The case body 1110 may be formed of a material having good thermal dissipation properties, e.g., a metal material or a resin material.

The light emitting module 1130 may include a board 1132 and at least one light emitting device package 200 mounted on the board 1132.

A circuit pattern may be printed on a dielectric to manufacture the board 1132. For example, the board 1132 may include a printed circuit board (PCB), a metal core PCB, a flexible PCB, and a ceramic PCB.

Also, the board 1132 may be formed of a material which may effectively reflect light or have a color by which light is effectively reflected, e.g., a white color or a silver color.

The at least one light emitting device package 200 may be mounted on the board 1132. The light emitting device package 200 may include at least one light emitting diode (LED) 100. The LED may include color LEDs, which respectively emit light having a red color, a green color, a blue color, and a white color and an ultraviolet (UV) LED emitting UV rays.

The light emitting module 1130 may have combinations of several light emitting devices 200 to obtain desired color and brightness. For example, the white LED, the red LED, and the green LED may be combined with each other to secure a high color rendering index (CRI).

The connection terminal 1120 may be electrically connected to the light emitting module 1130 to supply power to the light emitting module 1130. In the current embodiment, the connection terminal 1120 may be screwed and coupled to an external power source in a socket type, but is not limited thereto. For example, the connection terminal 1120 may have a pin shape, and thus, be inserted into the external power source. Alternatively, the connection terminal 1120 may be connected to the external power source by a wire.

Figure 10:
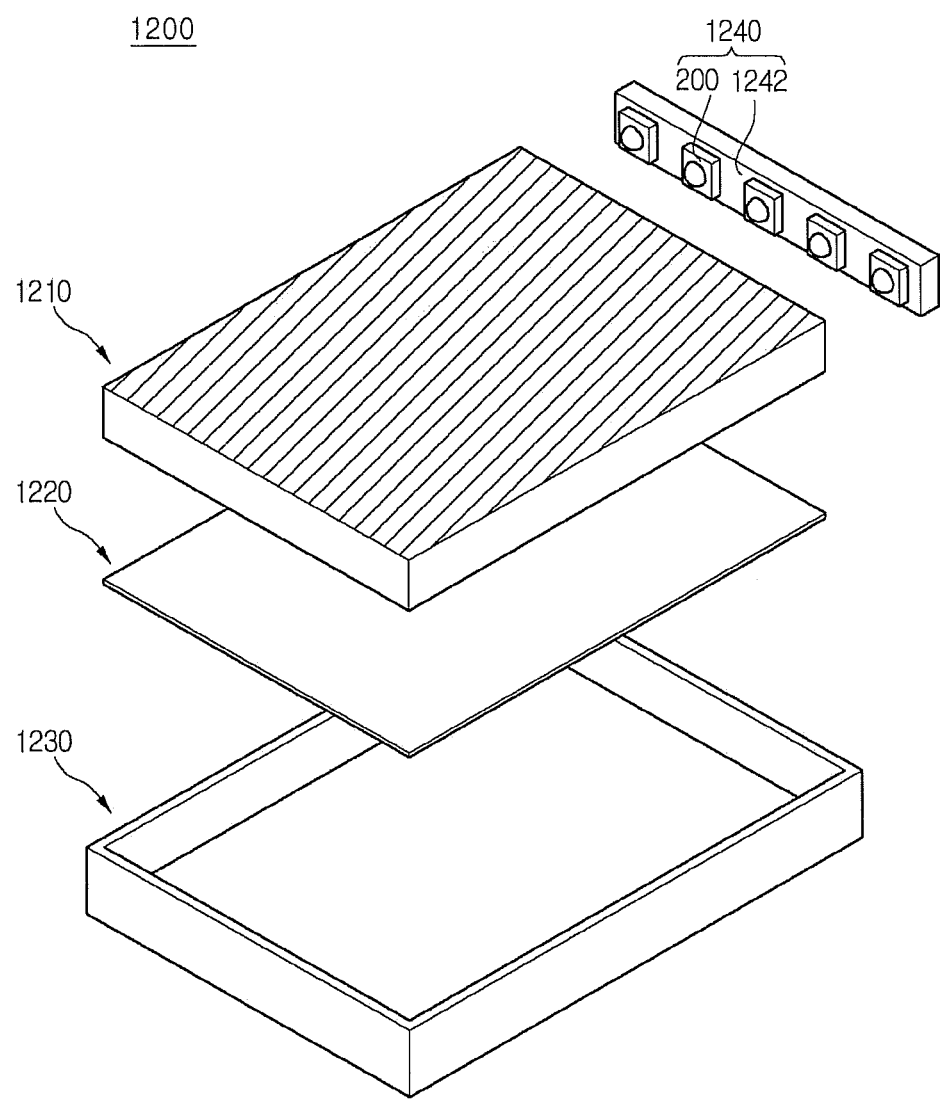
FIG. 10 is a perspective view of a backlight unit according to an embodiment.

FIG. 10 is an exploded perspective view of a backlight unit 1200 according to an embodiment. However, the backlight unit 1200 of FIG. 10 is described as an example of the lighting system. Thus, the present disclosure is not limited thereto.

The backlight unit 1200 according to the current embodiment may include a light guide plate 1210, a light emitting module 1240 providing light to the light guide plate 1210, a reflective member 1220 under the light guide plate 1210, and a bottom cover 1230 receiving the light guide plate 1210, the light emitting module 1240, and the reflective member 1220, but is not limited thereto.

The light guide plate 1210 diffuses light to produce planar light. For example, the light guide plate 1210 may be formed of a transparent material, e.g., one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may serve as a light source of a display device including the backlight unit 1200.

The substrate 1240 may contact the light guide plate 1210, but is not limited thereto. Specifically, the light emitting module 1240 may include a board 1242 and a plurality of light emitting device packages 200 mounted on the board 1242. Here, the board 1242 may contact the light guide plate 1210, but is not limited thereto.

The board 1242 may be a printed circuit board (PCB) including a circuit pattern (not shown). Alternatively, the board 1242 may include a metal core PCB (MCPCB) or a flexible PCB (FPCB) as well as a general PCB, but is not limited thereto.

The plurality of light emitting device packages 200 may be mounted on the board 1242 so that a light emission surface through which light is emitted is spaced a predetermined distance from the light guide plate 1210.

The reflective member 1220 may be disposed under the light guide plate 1210. Since the reflective member 1220 reflects light incident onto an under surface of the light guide plate 1210 to supply the light upward, the brightness of the backlight unit 1200 may be improved. For example, the reflective member 1220 may be formed of one of PET, PC, and PVC resins, but is not limited thereto.

The bottom cover 1230 may receive the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press molding process or an extrusion molding process.

In the light emitting device, the light emitting device package, and the lighting system according to the current embodiment, the reflective layer may be manufactured in the patterned shape to improve the external light extraction efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a reflective layer, wherein a lower edge of the reflective layer has a protruding portion;
an ohmic layer disposed on the reflective layer, wherein the reflective layer is thicker than the ohmic layer, wherein a lower edge of the ohmic layer has a protruding portion, and wherein the lower edge of the ohmic layer and the lower edge of the reflective layer are not exposed;
a second conductive type semiconductor layer on the reflective layer, wherein the second conductive type semiconductor layer is spaced apart from the reflective layer;
an active layer on the second conductive type semiconductor layer;
a first conductive type semiconductor layer on the active layer, wherein the first conductive type semiconductor layer includes a recess portion and edge protruding portions on an edge surface, and wherein the recess portion includes a light extraction pattern on a first top surface of the recess portion;
a pad electrode on a second top surface of the recess portion, and
a branch electrode on the first conductive type semiconductor layer,
wherein the reflective layer is on a bottom surface of the second conductive type semiconductor layer,
wherein the reflective layer comprises a predetermined pattern,
wherein all bottom surface of the pad electrode is vertically overlapped with the predetermined pattern of the reflective layer,
wherein the branch electrode is on a third top surface of the first conductive type semiconductor layer, and the branch electrode is physically connected to the pad electrode,
wherein the predetermined pattern is further disposed in a region where the predetermined pattern vertically overlaps the branch electrode,
wherein the predetermined pattern is disposed below the ohmic layer, and
wherein the ohmic layer is between the predetermined pattern and the second conductive type semiconductor such that the predetermined pattern is not in contact with the second conductive type semiconductor layer,
wherein the light extraction pattern is not vertically overlapped with the predetermined pattern of the reflective layer, and
wherein a depth of the recess is greater than a depth of the light extraction pattern.

2. The light emitting device according to claim 1, wherein the predetermined pattern has a polygonal shape in section.

3. The light emitting device according to claim 2, wherein the polygonal shape comprises at least one shape of a pyramid shape, a trapezoidal shape, or a square shape.

4. The light emitting device according to claim 1, wherein the predetermined pattern comprises a random roughness pattern in section.

5. The light emitting device according to claim 1, wherein the predetermined pattern comprises a strip pattern in plane.

6. The light emitting device according to claim 5, wherein the strip pattern comprises at least one pattern of a streamlined strip pattern, an inclined straight strip pattern, or a vertical straight strip pattern.

7. The light emitting device according to claim 1, wherein the predetermined pattern comprises a straight strip pattern in plane.

8. The light emitting device according to claim 7, wherein the straight strip pattern comprises at least one pattern of an inclined straight strip pattern or a vertical straight strip pattern.

9. The light emitting device according to claim 1, wherein the predetermined pattern comprises a circular pattern in plane.

10. The light emitting device according to claim 1, wherein the pad electrode has an area greater than 10% of the first conductive type semiconductor layer.

11. The light emitting device according to claim 10, wherein the pad electrode has an area greater than 10% to 15% of the first conductive type semiconductor layer.

12. The light emitting device according to claim 1, wherein the second conductive type semiconductor layer, the active layer, and the first conductive type semiconductor layer constitute a light emitting structure, and a protection member is further disposed outside a lower side of the light emitting structure,
a bonding layer is further disposed under the protection member,
wherein the protection member is disposed at only a lower outside of the light emitting structure,
wherein the protection member does not vertically overlap with the pad electrode,
wherein the predetermined pattern is disposed between the ohmic layer and the bonding layer,
wherein protruding portion of the ohmic layer and protruding portion of the reflective layer are vertically overlapped with the edge protruding portions.

13. The light emitting device according to claim 12, wherein at least one portion of the protection member vertically overlaps the light emitting structure.

14. The light emitting device according to claim 12, wherein the protection member is formed of at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, Cr and combinations thereof.

15. The light emitting device according to claim 12, wherein the protection member does not vertically overlap with the predetermined pattern of the reflective layer.

16. The light emitting device according to claim 12, wherein a top surface of the reflective layer is flush with a top surface of the protection member.

17. The light emitting device according to claim 12, further comprising a passivation layer disposed outside the light emitting structure and disposed on the protection member.

18. The light emitting device according to claim 1, wherein a top surface of the predetermined pattern is flush with a top surface of the reflective layer.

19. The light emitting device according to claim 1, wherein a top surface of the predetermined pattern contacts a bottom surface of the ohmic layer.

20. The light emitting device according to claim 1, wherein a width of the ohmic layer is larger than a width of the reflective layer.

21. The light emitting device according to claim 1, wherein an area of the pad electrode is greater than 10% of an area of the reflective layer.

22. The light emitting device according to claim 21, wherein the area of the pad electrode is 10% to 15% of the area of the reflective layer.

* * * * *